United States Patent
Lim et al.

(10) Patent No.: US 9,748,469 B2
(45) Date of Patent: Aug. 29, 2017

(54) MULTILAYER ACTUATOR AND DISPLAY DEVICE COMPRISING THE SAME

(71) Applicant: LG DISPLAY CO., LTD., Seoul (KR)

(72) Inventors: MyungJin Lim, Goyang-si (KR); SuSeok Choi, Seongnam-si (KR); Yong-Su Ham, Seoul (KR); Taeheon Kim, Seoul (KR); YongWoo Lee, Goyang-si (KR); Seulgi Choi, Incheon (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 14/979,769

(22) Filed: Dec. 28, 2015

(65) Prior Publication Data

US 2016/0190428 A1  Jun. 30, 2016

(30) Foreign Application Priority Data

Dec. 31, 2014 (KR) .................. 10-2014-0195977
Jun. 16, 2015 (KR) .................. 10-2015-0085104

(51) Int. Cl.

| | |
|---|---|
| *H01L 41/083* | (2006.01) |
| *H05K 5/00* | (2006.01) |
| *H01L 41/04* | (2006.01) |
| *H05K 1/02* | (2006.01) |
| *G06F 1/16* | (2006.01) |
| *H01L 41/193* | (2006.01) |
| *G09F 9/30* | (2006.01) |

(Continued)

(52) U.S. Cl.
CPC .......... *H01L 41/083* (2013.01); *G06F 1/1652* (2013.01); *H01L 41/042* (2013.01); *H01L 41/193* (2013.01); *H05K 1/028* (2013.01); *H05K 5/0017* (2013.01); *G09F 9/301* (2013.01); *H01L 41/0926* (2013.01); *H01L 41/277* (2013.01); *H05K 2201/05* (2013.01)

(58) Field of Classification Search
CPC ... H01L 41/083; H01L 41/042; H01L 41/193; H04R 17/00; H04R 17/025; G06F 1/1652; H05K 1/028; H05K 5/0017
USPC ......................................... 310/311–371, 800
See application file for complete search history.

(56) References Cited

U.S. PATENT DOCUMENTS

| | | | | |
|---|---|---|---|---|
| 4,245,172 A | * | 1/1981 | Shirley | ................. G01H 11/08 310/332 |
| 4,330,730 A | * | 5/1982 | Kurz | .................... H01L 41/094 310/330 |
| 4,675,959 A | | 6/1987 | Sprout | |

(Continued)

FOREIGN PATENT DOCUMENTS

| | | | | |
|---|---|---|---|---|
| CN | WO-99-26261 | * | 5/1999 | ............... H01G 9/28 |
| DE | 2742977 A1 | | 3/1978 | |

(Continued)

OTHER PUBLICATIONS

Office Action of Japanese Patent Office in Appl'n No. 2015-249292, dated Oct. 25, 2016.

*Primary Examiner* — Thomas Dougherty
(74) *Attorney, Agent, or Firm* — Dentons US LLP

(57) ABSTRACT

Provided is a multilayer actuator and a display device comprising the same with improved driving displacement that includes, for example, a plurality of electroactive layers, wherein the electroactive layers comprise a ferroelectric polymer, and polarization directions of all electroactive layers are substantially the same.

13 Claims, 8 Drawing Sheets

(51) Int. Cl.
*H01L 41/09* (2006.01)
*H01L 41/277* (2013.01)

(56) References Cited

U.S. PATENT DOCUMENTS

| | | | | |
|---|---|---|---|---|
| 4,833,659 | A * | 5/1989 | Geil | B06B 1/0603 310/326 |
| 5,153,859 | A * | 10/1992 | Chatigny | B32B 38/0008 264/204 |
| 5,166,573 | A * | 11/1992 | Brown | B06B 1/0688 310/330 |
| 5,285,551 | A * | 2/1994 | Weiland | B60N 3/026 16/430 |
| 5,367,500 | A * | 11/1994 | Ng | H01L 41/1132 310/328 |
| 5,440,194 | A * | 8/1995 | Beurrier | H01L 41/0836 310/328 |
| 5,517,467 | A * | 5/1996 | Fromont | B06B 1/0688 310/337 |
| 5,559,387 | A * | 9/1996 | Beurrier | H01L 41/0836 310/328 |
| 5,608,692 | A * | 3/1997 | Toda | H04R 17/005 310/325 |
| 5,700,359 | A | 12/1997 | Bauer | |
| 5,703,425 | A * | 12/1997 | Feral | H01L 41/338 310/328 |
| 5,835,453 | A * | 11/1998 | Wynne | B06B 1/06 29/25.35 |
| 6,184,608 | B1 * | 2/2001 | Cabuz | H02N 1/006 310/309 |
| 7,034,432 | B1 * | 4/2006 | Pelrine | F02G 1/043 310/309 |
| 7,468,575 | B2 * | 12/2008 | Pelrine | F02G 1/043 310/363 |
| 7,492,076 | B2 * | 2/2009 | Heim | F04B 19/006 310/330 |
| 8,181,338 | B2 * | 5/2012 | Benslimane | B81B 3/0021 29/825 |
| 8,421,311 | B2 * | 4/2013 | Chuang | G01L 1/16 310/328 |
| 8,432,057 | B2 * | 4/2013 | Filardo | F03B 13/188 290/54 |
| 9,207,134 | B2 * | 12/2015 | Ting | B06B 1/0622 |
| 2003/0227825 | A1 * | 12/2003 | Benjamin | B06B 1/064 367/153 |
| 2009/0316306 | A1 * | 12/2009 | Yao | G11B 5/4826 360/245.3 |
| 2012/0178880 | A1 * | 7/2012 | Zhang | C08L 27/16 525/199 |
| 2013/0123692 | A1 * | 5/2013 | Zhang | A61M 25/0158 604/95.05 |
| 2013/0264912 | A1 | 10/2013 | Kwon et al. | |
| 2015/0107374 | A1 * | 4/2015 | Ting | B06B 1/0622 73/862.043 |
| 2015/0155474 | A1 | 6/2015 | Tanimoto et al. | |
| 2015/0182652 | A1 * | 7/2015 | Baik | B01J 21/063 422/240 |
| 2015/0322220 | A1 * | 11/2015 | Choi | B32B 37/1207 156/306.6 |
| 2016/0016369 | A1 * | 1/2016 | Tarbutton | B33Y 70/00 264/435 |
| 2016/0049887 | A1 * | 2/2016 | Miyazawa | B25J 9/12 74/490.03 |
| 2016/0049888 | A1 * | 2/2016 | Kim | G01R 19/00 318/375 |
| 2016/0187985 | A1 * | 6/2016 | Lim | G06F 3/016 345/173 |

FOREIGN PATENT DOCUMENTS

| | | | | |
|---|---|---|---|---|
| EP | 0441438 A1 * | 8/1991 | | H01L 41/26 |
| JP | 59-31078 A * | 2/1984 | | H01L 41/08 |
| JP | 59-211291 A | 11/1984 | | |
| JP | 59-222977 A * | 12/1984 | | H01L 41/08 |
| JP | 2002-118297 A | 4/2002 | | |
| JP | 2002-150585 A * | 5/2002 | | G11B 7/095 |
| JP | 2005-064105 A | 3/2005 | | |
| KR | 2013-0101833 A * | 9/2013 | | C08J 5/18 |
| TW | 201405901 A | 2/2014 | | |
| TW | M473561 U | 3/2014 | | |
| WO | WO-89-02658 | * | 3/1999 | H01L 41/08 |
| WO | 2014/030963 A1 | 2/2014 | | |
| WO | 2014/197274 A1 | 12/2014 | | |
| WO | 2013/183594 A1 | 1/2016 | | |

* cited by examiner

MULTILAYER ACTUATOR AND DISPLAY DEVICE COMPRISING THE SAME

This application claims the priorities of Korean Patent Application No. 10-2014-0195977 filed on Dec. 31, 2014 and Korean Patent Application No. 10-2015-0085104 filed on Jun. 16, 2015, in the Korean Intellectual Property Office, the disclosures of which are incorporated herein by reference for all purposes as if fully set forth herein.

BACKGROUND OF THE INVENTION

Field of the Invention

The present disclosure relates to a multilayer actuator, a display device comprising the same, and a method of manufacturing the same.

Discussion of the Related Art

Recently, as users desire to conveniently use various display devices such as liquid crystal display (LCD) devices and organic light emitting diode (OELD) displays, the use of touch-type display devices has become common. In this regard, researches have been continuously conducted on an actuator in order to provide direct and various touch feedbacks to users. In addition, researches have been conducted to implement various displacements of a flexible display panel by attaching an actuator to the flexible display panel.

In general, a conventional display device has employed a vibration motor such as an eccentric rotating mass vibration motor (ERM) or a linear resonance actuator (LRA) as an actuator. The vibration motor is designed to vibrate the whole display device, and thus has a problem in that a mass body needs to be increased in size to increase its vibration power. In addition, the vibration motor has disadvantages in that frequency modulation for adjusting a level of vibration is difficult, a response speed is significantly low, and the vibration motor is not suitably used for the flexible display device.

To address these issues, a shape memory alloy (SMA) and electro-active ceramics (EAC) have been developed as materials of the actuator. However, the SMA has a low response speed and a short lifespan, and is opaque, and the EAC is fragile. Thus, there has been a difficulty in applying the SMA and the EAC to a display device, in particular, a flexible display device.

In this regard, an actuator technology using an electro-active polymer (EAP) has been receiving attention in the industry. The EAP refers to a polymer that can be deformed by electrical stimulation, and refers to a polymer that can repeatedly expand, contract and bend by electrical stimulation. Researches have been conducted to manufacture an actuator comprising the EAP as an electroactive layer, and such an actuator is attached to a flexible display panel, thereby implementing diverse bending of a flexible display.

However, bending ability of an actuator comprising only one electroactive layer is restricted due to its increased thickness and high driving voltage. To address these problems, a multilayer actuator configured by stacking a plurality of unit actuators, each of which comprises one electroactive layer, has been introduced. Such a multilayer actuator comprising a plurality of electroactive layers can implement a higher driving displacement at the same thickness when compared to an actuator comprising only one electroactive layer.

An electroactive layer of a unit actuator in a conventional multilayer actuator typically comprises a dielectric elastomer. The dielectric elastomer does not have polarization in a natural state, and thus, previous researches have not considered polarizations of a plurality of electroactive layers. As a result, previous researches have not considered a form of arrangement of polarization directions of a plurality of electroactive layers.

Recently, a ferroelectric polymer, which can ensure a higher driving displacement when compared to the dielectric elastomer, has been implemented as an electroactive layer. The ferroelectric polymer has a natural polarization in a specific direction, and thus, there is a need for considering a form of arrangement of polarization directions of a plurality of electroactive layers comprising the ferroelectric polymer in a multilayer actuator. In this regard, some methods have been introduced in which a direction of an applied electric field for each of the plurality of electroactive layers is adjusted based on expansion and contraction of the electroactive layers according to the direction of the applied electric field. However, significant effectiveness has not been achieved so far.

SUMMARY OF THE INVENTION

Accordingly, the present invention is directed to a multilayer actuator, a display device comprising the same, and a method of manufacturing the same that substantially obviate one or more problems due to limitations and disadvantages of the related art.

An advantage of the present invention is to provide a multilayer actuator and a display device comprising the same with improved driving displacement.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In order to achieve the above-described object, an aspect of the present disclosure provides a multilayer actuator comprising a plurality of electroactive layers disposed on each other, each comprising a ferroelectric polymer, wherein the polarization directions of all electroactive layers are the same. According to a preferred embodiment of the present invention, a number of electro-active layers is at least three. It has turned out that in an arrangement with three or more electro-active layers, a driving displacement of the multilayer actuator is greatly affected by a form of arrangement of polarization directions of the electro-active layers rather than by the direction of an electric field applied to the electro-active layers.

According to another feature of the present disclosure, the electroactive layers are made of the same material.

According to yet another feature of the present disclosure, the electroactive layers may comprise a polyvinylidene fluoride (PVDF)-based polymer.

According to still another feature of the present disclosure, the electro-active layers have a natural polarization applied by a stretching process or polling process.

According to still another feature of the present disclosure, the polarization direction of the electroactive layers is perpendicular to the extension direction of the electroactive layers.

According to still another feature of the present disclosure, the multilayer actuator comprises a plurality of unit actuators disposed on each other, each of these unit actuators comprising one of the electroactive layers, a lower electrode and an upper electrode facing each other with the electroactive layer interposed therebetween. According to another preferred embodiment of the present invention, the number of unit actuators is at least three.

According to still another feature of the present disclosure, the multilayer actuator is configured to generate an electric field between the lower electrode and the upper electrode of each unit actuator, wherein the direction of the electric field generated in all unit actuators is the same.

According to still another feature of the present disclosure, the multilayer actuator further comprises a plurality of adhesive layers, with each one adhesive layer disposed between two adjacent unit actuators. According to still another feature of the present disclosure, the adhesive layers comprise a dielectric elastomer and a high-dielectric filler.

An aspect of the present disclosure also provides a display device comprising a display panel and a multilayer actuator as described above, which is disposed under a display panel.

Preferably, this display device comprises and upper cover, disposed over the display panel and the multilayer actuator and a lower cover disposed to face the upper cover and disposed below the display panel and the multilayer actuator, wherein the lower cover and the upper cover consist of a material having flexibility.

According to another preferred embodiment of the present invention, the display panel comprises a flexible substrate.

An aspect of the present disclosure also provides a method for operating a multilayer actuator as described above, said method comprising the generation of an electric field between the lower electrode and the upper electrode of each unit actuator, wherein the direction of the electric field generated in all unit actuators is the same.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
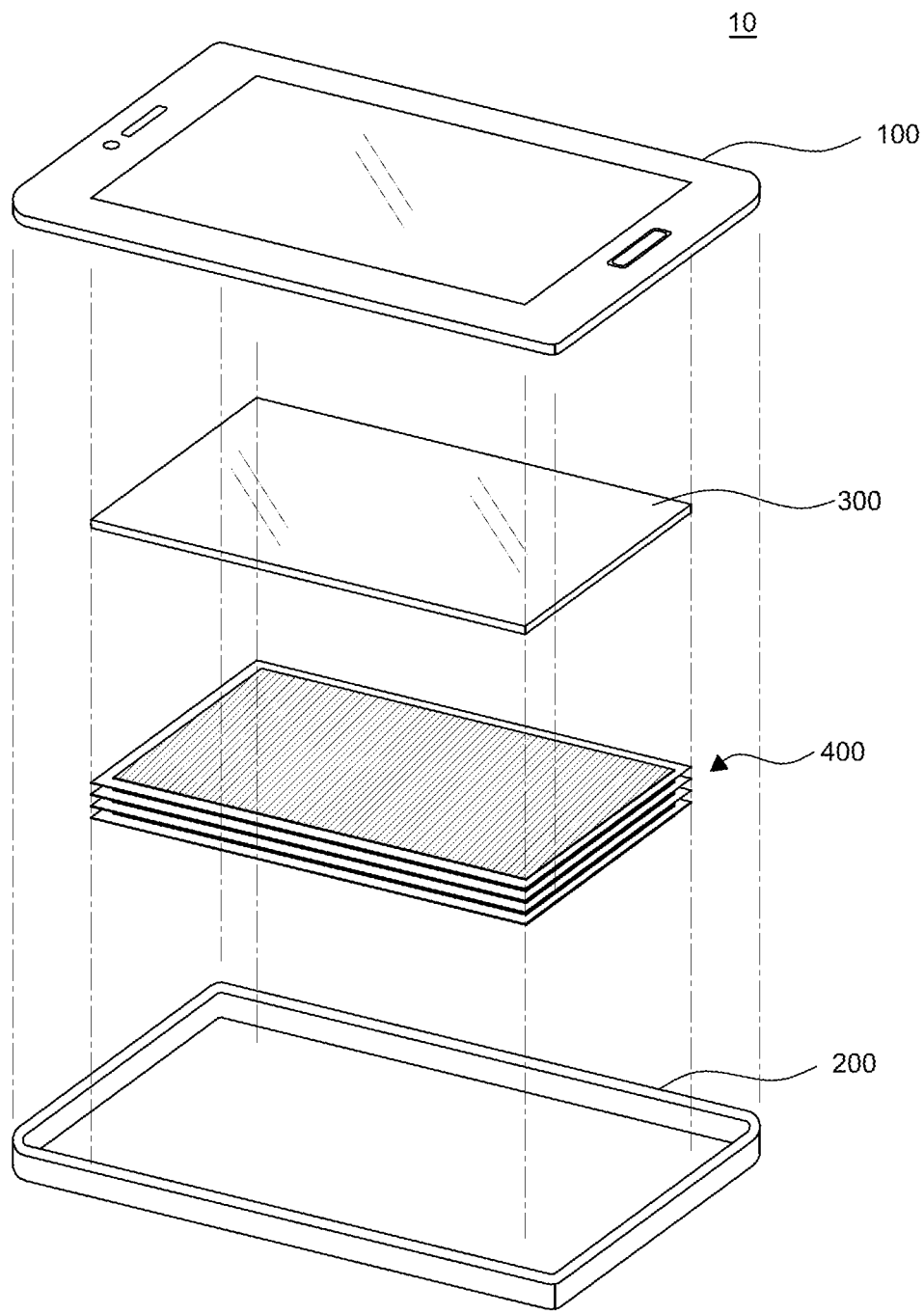
FIG. 1 is a schematic exploded perspective view illustrating a configuration of a display device according to an embodiment of the present disclosure.

Advantages and features of the present disclosure and methods of accomplishing the same may be understood more readily with reference to the following detailed description of exemplary embodiments and the accompanying drawings. However, the present disclosure will be embodied in many different forms and is not limited to the embodiments set forth herein. Rather, these embodiments make the present disclosure complete, and are provided such that those skilled in the art fully understand the scope of the present disclosure. The present disclosure will be merely defined by the appended claims.

When an element or layer is described to be "on" another element or layer, the element or layer may be disposed directly on the other element or layer or disposed on the other element or layer with a still another element or layer interposed therebetween.

Although the terms "first", "second", and the like are used to describe various components, the components are not limited by the terms. The terms are merely used to distinguish one component from another component. Thus, a first component mentioned below may correspond to a second component within the spirit of the present disclosure.

The same reference numeral refers to the same component throughout the specification.

A size and a thickness of each configuration illustrated in the drawings are for convenience of description, and the present disclosure is not necessarily limited to the size and thickness of the illustrated configuration.

Respective features of several embodiments of the present disclosure may be wholly or partially combined or united with each other, and interlocking and driving can be technically configured in various manners. Respective embodiments may be implemented independently of each other or implemented together by being linked to each other.

Hereinafter, various embodiments of the present disclosure will be described in detail, examples of which are illustrated with reference to the accompanying drawings.

FIG. 1 is a schematic exploded perspective view illustrating a configuration of a display device according to an embodiment of the present disclosure.

Referring to FIG. 1, the display device 10 according to the present embodiment comprises an upper cover 100, a lower cover 200, a flexible display panel 300, and a multilayer actuator 400.

The upper cover 100 is disposed over the flexible display panel 300 and the multilayer actuator 400 to cover the flexible display panel 300 and the multilayer actuator 400. The upper cover 100 protects internal components of the display device 10 from an external shock or a permeation of water or a foreign material. The upper cover 100 may be made of a material having a high flexibility, for example, plastic so as to be displaced when the multilayer actuator 400 is displaced by an electric field.

The lower cover 200 is disposed to face the upper cover 100, and disposed below the flexible display panel 300 and the multilayer actuator 400 to cover the flexible display panel 300 and the multilayer actuator 400. The lower cover 200 similarly protects internal components of the display device 10 from an external shock or a permeation of water or a foreign material. The lower cover 200 may be similarly made of a material having a high flexibility, for example, plastic so as to be displaced when the multilayer actuator 400 is displaced.

The flexible display panel 300 is disposed between the upper cover 100 and the lower cover 200. The flexible display panel 300 is a panel having flexibility so as to be bent as paper, and refers to a panel in which a display element for displaying an image is disposed. The flexible display panel 300 has flexibility, and thus may be displaced together with the multilayer actuator 400 when the multilayer actuator 400 is displaced by an electric field. The flexible display panel 300 may comprise at least a flexible substrate to ensure flexibility. For example, the flexible display panel 300 may be an organic light-emitting display panel. The organic light-emitting display panel is a display panel in which an organic light-emitting layer emits light when a current is allowed to flow through the organic light-emitting layer. The organic light-emitting display panel emits light having a particular wavelength using the organic light-emitting layer. The organic light-emitting display panel comprises at least a cathode, the organic light-emitting layer, and an anode.

The multilayer actuator 400 is disposed between the upper cover 100 and the lower cover 200. The multilayer actuator 400 is disposed below the flexible display panel 300, and is attached to the flexible display panel 300 by an adhesive such as an optical clear adhesive (OCA) or an optical clear resin (OCR). The multilayer actuator 400 may be displaced in response to an expansion or contraction to its electroactive layers. This displacement includes a bending of the multilayer actuator 400. In response to the multilayer actuator 400 being displaced, the upper cover 100, the lower cover 200, and the flexible display panel 300 may be displaced, and thus the whole display device 10 may be displaced.

Figure 2:
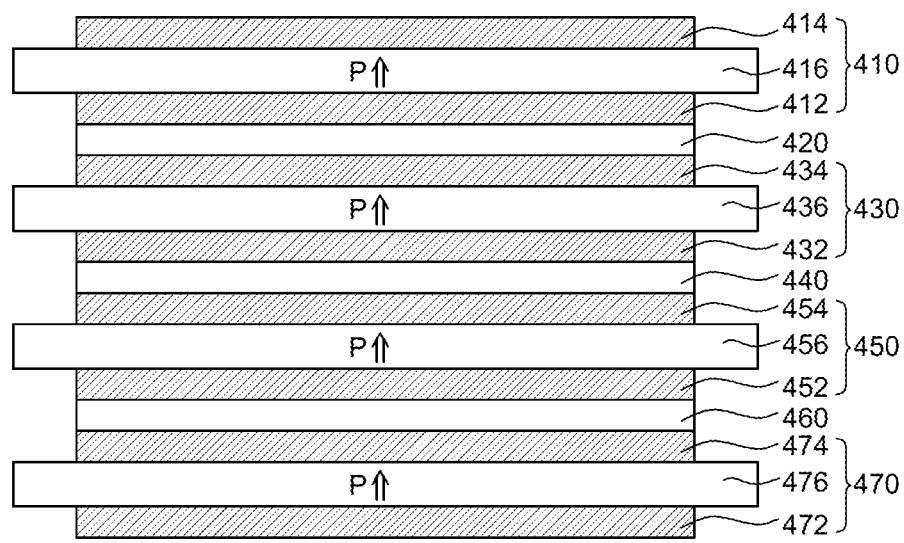
FIG. 2 is a schematic cross-sectional view illustrating a multilayer actuator of a display device according to an embodiment of the present disclosure.

FIG. 2 is a schematic cross-sectional view of a multilayer actuator of a display device according to an embodiment of the present disclosure.

Referring to FIG. 2, the multilayer actuator 400 according to the present embodiment comprises a first unit actuator 410, a first adhesive layer 420, a second unit actuator 430, a second adhesive layer 440, a third unit actuator 450, a third adhesive layer 460, and a fourth unit actuator 470.

The first unit actuator 410 is one unit actuator comprised in the multilayer actuator 400, and configured to be displaced by an electric field. As illustrated in FIG. 2, the first unit actuator 410 comprises a first lower electrode 412, a first upper electrode 414, and a first electroactive layer 416 disposed between the first lower electrode 412 and the first upper electrode 414.

As illustrated in FIG. 2, the first unit actuator 410, the second unit actuator 430, the third unit actuator 450 and the fourth unit actuator 470 are stacked on top of each other in a direction vertical to their extension directions, which correspond to the extension directions of the respective electro-active layers 416, 436, 456 and 476 comprised within the unit actuators 410, 430, 450 and 470.

The first lower electrode 412 and the first upper electrode 414 perform a function of forming an electric field in the first electroactive layer 416 by receiving a voltage applied from outside, which generates a potential difference between the first lower electrode 412 and the first upper electrode 414 and forms the electric field in the first electroactive layer 416. To do so, voltages having different levels are applied to the first lower electrode 412 and the first upper electrode 414. For example, while a positive voltage is applied to the first lower electrode 412, a ground voltage may be applied to the first upper electrode 414. Alternatively, while a negative voltage is applied to the first lower electrode 412, a ground voltage may be applied to the first upper electrode 414.

The electric field may be formed in the first electroactive layer 416 in a different direction according to a level of a voltage applied to each of the first lower electrode 412 and the first upper electrode 414. For example, when a voltage applied to the first lower electrode 412 is lower than a voltage applied to the first upper electrode 414, an electric field may be formed upward in the first electroactive layer 416. On the other hand, when a voltage applied to the first upper electrode 414 is higher than a voltage applied to the first lower electrode 412, an electric field may be formed downward in the first electroactive layer 416.

An alternating current (AC) voltage or a direct current (DC) voltage may be applied to the first lower electrode 412 and the first upper electrode 414. When an AC voltage is applied to the first lower electrode 412 and the first upper electrode 414, the first unit actuator 410 may be periodically displaced. When a DC voltage is applied to the first lower electrode 412 and the first upper electrode 414, the first unit actuator 410 may be maintained in a bent state.

The first lower electrode 412 and the first upper electrode 414 may be made of a conductive material. For example, the first lower electrode 412 and the first upper electrode 414 may be made of a metal material such as gold (Au), copper (Cu), titanium (Ti), chrome (Cr), molybdenum (Mo), aluminum (Al), an Al—Cu alloy, or a conductive polymer such as PEDOT[Poly(3,4-EthyleneDiOxyThiophene)]:PSS [Poly (4-StyreneSulfonic acid)], polypyrrole, polyaniline. However, the present disclosure is not limited thereto. The first lower electrode 412 and the first upper electrode 414 may be made of the same material or different materials.

As thicknesses of electrodes disposed on a lower surface and an upper surface of an electroactive layer increase, the number of electroactive layers comprised in a multilayer actuator having a constant thickness decreases. As a driving displacement of the multilayer actuator increases as the number of electroactive layers increases, it is preferable that the thicknesses of the electrodes disposed on the lower surface and the upper surface of the electroactive layer are as thin as possible in order to dispose as many electroactive layers as possible in the multilayer actuator having the constant thickness. For example, it is preferable that thicknesses of the first lower electrode 412 and the first upper electrode 414 disposed on a lower surface and an upper surface of the first electroactive layer 416 are in a range of 50 nm to 100 nm.

When the same voltage is applied to the first lower electrode 412 and the first upper electrode 414, a strength of an electric field formed in the first electroactive layer 416 increases as sheet resistances of the first lower electrode 412 and the first upper electrode 414 decrease. As a result, it is preferable that the first lower electrode 412 and the first upper electrode 414 have as low sheet resistance as possible, for example, a sheet resistance of 200 Ω/sq or less.

The first lower electrode 412 and the first upper electrode 414 may be disposed on both surfaces of the first electroactive layer 416 using various processes. For example, the first lower electrode 412 and the first upper electrode 414 may be disposed on both surfaces of the first electroactive layer 416 using a process such as sputtering, printing, and slit coating. In particular, when the first lower electrode 412 and the first upper electrode 414 are made of the same material, the first lower electrode 412 and the first upper electrode 414 may be simultaneously disposed in the same process.

The first electroactive layer 416 may be disposed between the first lower electrode 412 and the first upper electrode 414 and displaced by an electric field formed by the first lower electrode 412 and the first upper electrode 414.

The first electroactive layer 416 comprises a ferroelectric polymer which has a polarization in a natural state. For example, the first electroactive layer 416 comprises a polyvinylidene fluoride (PVDF)-based polymer such as a PVDF homopolymer or a PVDF co-polymer. A displacement of the first electroactive layer 416 may be induced by applying an electric field to the first electroactive layer 416, which has a polarization in a specific direction, for example, upward or downward. The terms "upward" and "downward" refer to directions perpendicular to an extension direction of the respective electro-active layer, a direction parallel to a stacking direction of the electro-active layers disposed on top of each other.

A polarization direction of the first electroactive layer 416 may be determined according to an arrangement of atoms comprised in the first electroactive layer 416.

Figure 3A:
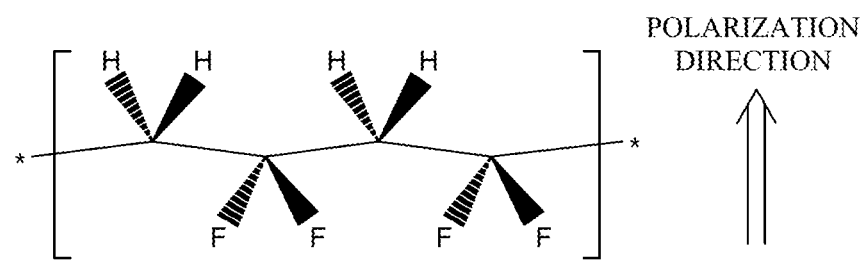
FIGS. 3A and 3B are diagrams illustrating polarization directions of a first electroactive layer comprising a polyvinylidene fluoride-based polymer.
Figure 3B:
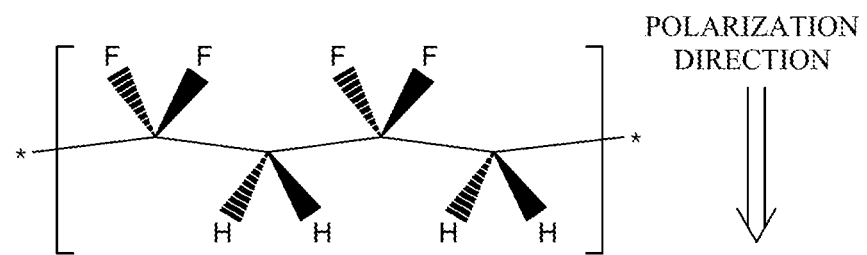
Figure 4A:
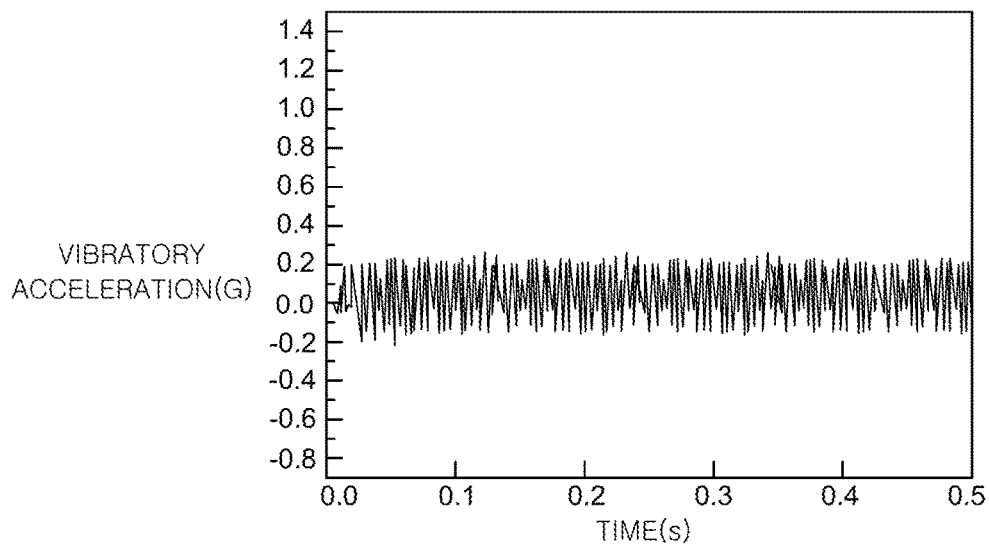
FIGS. 4A, 4B, 4C, and 4D are graphs obtained by measuring vibratory accelerations of multilayer actuators of Example 1, Example 2, Comparative Example 1, and Comparative Example 2.
Figure 4B:
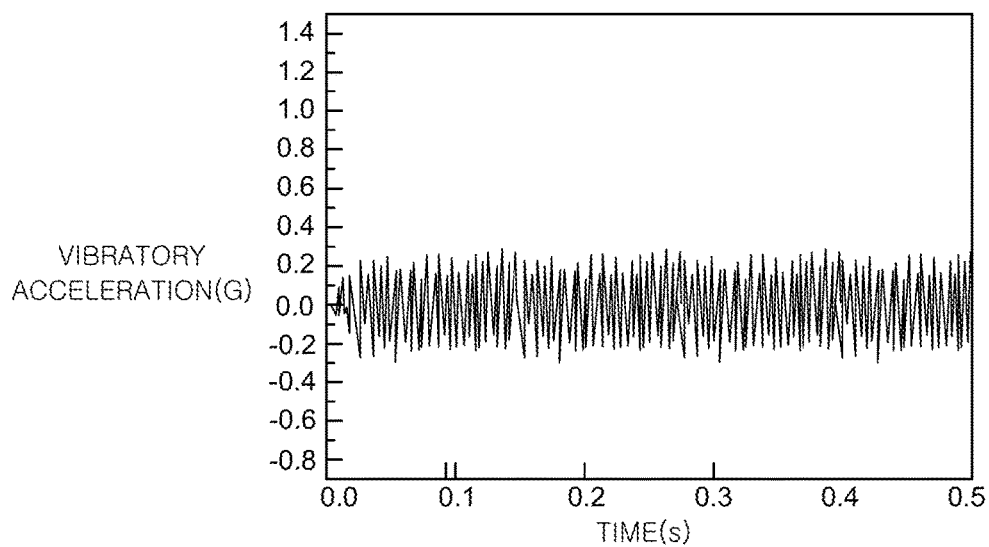
Figure 4C:
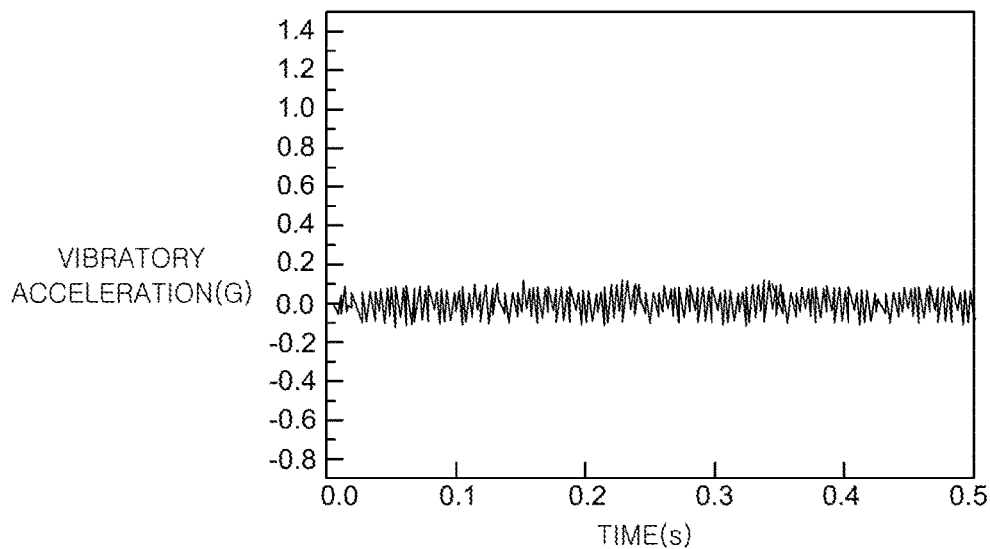
Figure 4D:
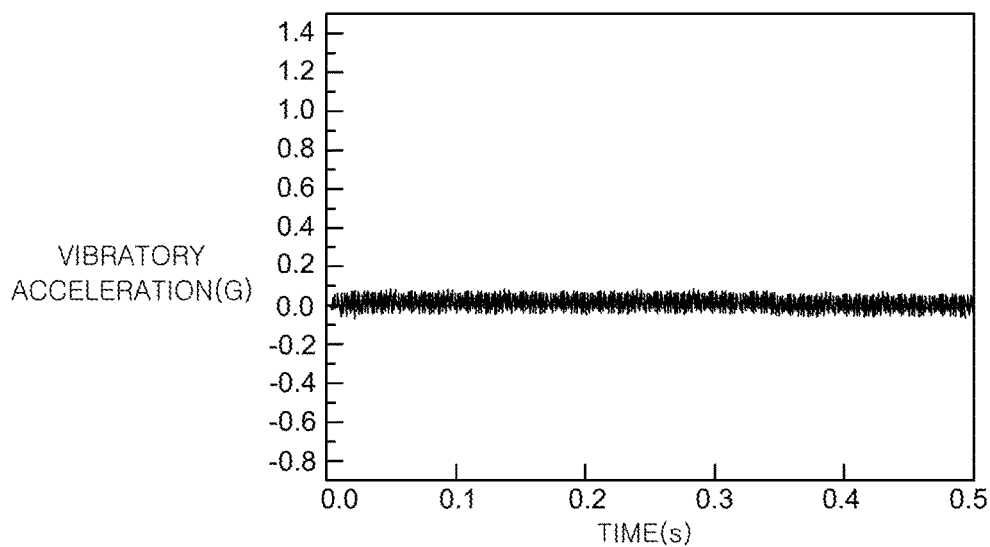

FIGS. 3A and 3B are diagrams illustrating polarization directions of the first electroactive layer comprising a polyvinylidene fluoride-based polymer. In FIGS. 3A and 3B, the polarization directions of the first electroactive layer 416 will be described on the assumption that the first electroactive layer 416 comprises a polyvinylidene fluoride-based polymer.

Referring to FIG. 3A, it can be understood that the polarization direction of the first electroactive layer 416 corresponds to an upward direction since fluorine (F) atoms comprising many electrons are disposed in a lower part and hydrogen (H) atoms comprising a few electrons are disposed in an upper part of the first electroactive layer 416. In a polyvinylidene fluoride-based polymer, the polarization direction may be defined as a direction from the F atoms to the H atoms.

Referring to FIG. 3B, it can be understood that the polarization direction of the first electroactive layer 416 corresponds to a downward direction since F atoms comprising many electrons are disposed in an upper part and H atoms comprising a few electrons are disposed in a lower part of the first electroactive layer 416.

The first electroactive layer 416 may be manufactured by a co-extrusion process rather than a solution casting process. When an electroactive layer is manufactured using a dielectric elastomer such as polydimethyl siloxane (PDMS), a solution casting process is generally used to apply a solution to a substrate and dry the solution. This is because the dielectric elastomer may ensure a permittivity of a certain level using a simple solution casting process. However, the ferroelectric polymer such as a polyvinylidene fluoride-based polymer may not ensure a high permittivity when formed by a solution casting process, and thus, a co-extrusion process together with a stretching process or a polling process, may be applied to ensure a high permittivity.

In this regard, the first electroactive layer 416 may be a film subjected to a stretching process or a polling process. The stretching process refers to a process of pulling and orienting a polymer chain in a heated state, and the polling process refers to a process of arranging atoms having particular charges in one direction by applying a high DC voltage to a polymer. When the stretching process or the polling process is applied to the first electroactive layer 416, the first electroactive layer 416 may function as an electroactive layer by ensuring a high permittivity. For example, PVDF corresponding to the PVDF homopolymer may function as an electroactive layer by being stretched and polled, and P(VDF-TrFE)(Poly(VinyliDene Fluoride)-trifluoroethylene corresponding to the PVDF co-polymer may function as an electroactive layer by being polled.

When the first electroactive layer 416 is manufactured by a co-extrusion process together with a stretching process or a polling process, configuring the first unit actuator 410 with the first lower electrode 412, the first upper electrode 414 and the first electroactive layer 416 as illustrated in FIG. 2, may be advantageous in terms of a driving displacement when compared to configuring the first unit actuator 410 merely with one electrode and a first electroactive layer. As a distance between two electrodes decreases, a strength of electric field generated by the same driving voltage increases. While only the first electroactive layer 416 is present between two electrodes, that is, the first lower electrode 412 and the first upper electrode 414 in the former case, an adhesive layer that bonds two unit actuators together can be present in addition to the first electroactive layer between the two electrodes in the latter case. Thus, the distance between the two electrodes is shorter in the former case than in the latter case.

A thickness of the first electroactive layer 416 may be freely selected by those skilled in the art based on, for example, power consumption and driving voltage for a normal operation of the first unit actuator 410. The thickness of the first electroactive layer 416 may be preferably 50 µm to 400 µm. The thickness of the first electroactive layer 416 may be more preferably 100 µm to 300 µm. Here, when the thickness of the first electroactive layer 416 is less than 50 µm, a sufficient voltage for a normal operation of the first unit actuator 410 may not be applied. In addition, when the thickness of the first electroactive layer 416 is greater than 400 µm, a high driving voltage may be required to generate a Maxwell stress for a normal operation of the first unit actuator 410, and thus, its power consumption may excessively increase.

The first adhesive layer 420 is disposed between the first unit actuator 410 and the second unit actuator 430 to bond the first unit actuator 410 and the second unit actuator 430 together. An OCA or an OCR may be used as the first adhesive layer 420. A high dielectric adhesive layer obtained by adding a high dielectric filler to a dielectric elastomer may be preferably used. Here, the dielectric elastomer may correspond to at least one material selected from the group including an acrylic-based polymer, a urethane-based polymer, and a silicone-based polymer, and preferably correspond to polydimethyl siloxane (PDMS). The high dielectric filler may correspond to at least one material selected from the group including piezoelectric ceramics, carbon nanoparticles, metal nanoparticles, and a conductive polymer, and preferably correspond to piezoelectric ceramics such as barium titanate ($BaTiO_3$).

The high dielectric adhesive layer has a high permittivity, and thus may perform a function as another electroactive layer in addition to its function as an adhesive layer. Specifically, the high dielectric adhesive layer may perform a function as another electroactive layer that is deformed by an electric field applied by adjacent electrodes, that is, the first lower electrode 412 of the first unit actuator 410 and a second upper electrode 434 of the second unit actuator 430 in addition to its function as an adhesive layer that bonds the first unit actuator 410 and the second unit actuator 430 together. As a result, when the high dielectric adhesive layer obtained by adding a high dielectric filler to a dielectric elastomer is employed as the first adhesive layer 420, a driving displacement of the multilayer actuator 400 in the same electric field may be enhanced, and a total permittivity of the multilayer actuator 400 may increase.

Each of the second unit actuator 430, the third unit actuator 450 and the fourth unit actuator 470 is one unit actuator comprised in the multilayer actuator 400 and configured to be displaced by an electric field.

As illustrated in FIG. 2, the second unit actuator 430 comprises a second lower electrode 432, the second upper electrode 434, and a second electroactive layer 436. Also, the third unit actuator 450 comprises a third lower electrode 453, a third upper electrode 454, and a third electroactive layer 456, and the fourth unit actuator 470 comprises a fourth lower electrode 472, a fourth upper electrode 474, and a fourth electroactive layer 476.

Here, each of the second electroactive layer 436, the third electroactive layer 456, and the fourth electroactive layer 476 comprises a ferroelectric polymer, which has a polarization in a natural state, and is configured to be displaced by an electric field. Further, all of the first electroactive layer 416, the second electroactive layer 436, the third electroactive layer 456, and the fourth electroactive layer 476 have the same or substantially similar polarization direction. For example, as illustrated in FIG. 2, all polarization directions of the first electroactive layer 416, the second electroactive layer 436, the third electroactive layer 456, and the fourth electroactive layer 476 correspond to the upward direction.

When a multilayer actuator comprises only two electroactive layers, a driving displacement of the multilayer actuator is greatly affected by a direction of an electric field applied to each of the plurality of electroactive layers rather than a form of arrangement of polarization directions of the plurality of electroactive layers. However, when a multilayer actuator comprises three or more electroactive layers, a driving displacement of the multilayer actuator is greatly affected by a form of arrangement of polarization directions of the electroactive layers rather than an electric field applied to the electroactive layers.

In this regard, in the multilayer actuator 400 according to the present embodiment, a driving displacement of the multilayer actuator 400 may be maximized by setting all the polarization directions of the first electroactive layer 416, the second electroactive layer 436, the third electroactive layer 456, and the fourth electroactive layer 476 in the same direction. When the multilayer actuator 400 comprises three or more electroactive layers 416, 436, 456, and 476, a higher driving displacement is obtained at a constant voltage by setting all polarization directions of the plurality of electroactive layers 416, 436, 456, and 476 in the same direction than by setting the polarization directions of the plurality of electroactive layers 416, 436, 456, and 476 in different directions. This result may be obtained irrespective of a scheme of adjusting a direction of an electric field applied to each of the plurality of electroactive layers 416, 436, 456, and 476.

Even when the polarization directions of all electroactive layers 416, 436, 456, and 476 are set in the same direction, the driving displacement of the multilayer actuator 400 is partially affected by the direction of the electric field. Specifically, even when the polarization directions of all of the electroactive layers 416, 436, 456, and 476 are set in the same direction, a higher driving displacement is obtained at a constant voltage by setting directions of electric fields applied to the electroactive layers 416, 436, 456, and 476 in the same direction than by setting directions of electric fields applied to the electroactive layers 416, 436, 456, and 476 in different directions. This will be further described below with reference to Table 1 and FIGS. 4A, 4B, 4C, and 4D.

The first electroactive layer 416, the second electroactive layer 436, the third electroactive layer 456, and the fourth electroactive layer 476 may be made of the same material, for example, a polyvinylidene fluoride-based polymer. When the first electroactive layer 416, the second electroactive layer 436, the third electroactive layer 456, and the fourth electroactive layer 476 are made of the same material, a co-extrusion process, a stretching process and a polling process may be performed at one time, and thus, it is possible to simplify a manufacturing process of the multilayer actuator 400. In addition, the first electroactive layer 416, the second electroactive layer 436, the third electroactive layer 456, and the fourth electroactive layer 476 similarly behave at a constant voltage, and thus, it has an advantage in predicting a driving displacement of the multilayer actuator 400.

The above description related to the first electroactive layer 416 may be adopted without changes in thicknesses, formation methods, and the like of the second electroactive layer 436, the third electroactive layer 456, and the fourth electroactive layer 476, and thus, a repeated description will be omitted. In addition, the second lower electrode 432, the third lower electrode 452, and the fourth lower electrode 472 may be configured to be substantially the same as the first lower electrode 412. Further, the second upper electrode 434, the third upper electrode 454, and the fourth upper electrode 474 may be configured to be substantially the same as the first upper electrode 414. Thus, a repeated description will be omitted.

The second adhesive layer 440 is disposed between the second unit actuator 430 and the third unit actuator 450, and the third adhesive layer 460 is disposed between the third unit actuator 450 and the fourth unit actuator 470. The second adhesive layer 440 and the third adhesive layer 460 may be configured to be substantially the same as the first adhesive layer 420, and thus a repeated description will be omitted.

For convenience of description, the multilayer actuator 400 of FIG. 2 is described to comprise the four unit actuators 410, 430, 450, and 470 and the three adhesive layers 420, 440, and 460 disposed among the four unit actuators 410, 430, 450, and 470. In other words, each one adhesive layer 420, 440, and 460 is disposed between two adjacent unit actuators 410, 430, 450 and 470.

A radius curvature and a vibratory acceleration of a multilayer actuator comprising four electroactive layers disposed in the same polarization direction, as illustrated in FIG. 2, were measured by varying directions of electric fields applied to the four electroactive layers in a state in which the multilayer actuator is attached to a flexible display panel. Furthermore, a radius curvature and a vibratory acceleration of a multilayer actuator comprising four electroactive layers disposed in different polarization directions were measured by varying directions of electric fields applied to the four electroactive layers in a state in which the multilayer actuator is attached to a flexible display panel.

In Example 1, an experiment was conducted such that a multilayer actuator in which all polarization directions of four electroactive layers are disposed upward is attached to a flexible display panel, downward electric fields are applied to a first electroactive layer and a third electroactive layer, and upward electric fields are applied to a second electroactive layer and a fourth electroactive layer. To this end, positive voltages were applied to a first upper electrode, a second lower electrode, a third upper electrode, and a fourth lower electrode, and negative voltages were applied to a first lower electrode, a second upper electrode, a third lower electrode, and a fourth upper electrode.

In Example 2, an experiment was conducted such that downward electric fields are applied to all of a first electroactive layer, a second electroactive layer, a third electroactive layer, and a fourth electroactive layer in a state in which a multilayer actuator in which all polarization directions of the four electroactive layers are arranged upward is attached to a flexible display panel. To this end, positive voltages were applied to a first upper electrode, a second upper electrode, a third upper electrode, and a fourth upper electrode, and negative voltages were applied to a first lower electrode, a second lower electrode, a third lower electrode, and a fourth lower electrode.

In Comparative Example 1, a multilayer actuator, in which polarization directions of four electroactive layers are arranged such that different polarization directions are alternately arranged, was prepared. Specifically, in the prepared multilayer actuator, polarization directions of a first electroactive layer and a third electroactive layer were arranged upward, and polarization directions of a second electroactive layer and a fourth electroactive layer were arranged downward. Then, an experiment was conducted such that downward electric fields are applied to the first electroactive layer and the third electroactive layer and upward electric fields are applied to the second electroactive layer and the fourth electroactive layer in a state in which the multilayer actuator is attached to a flexible display panel.

In Comparative Example 2, an experiment was conducted such that downward electric fields are applied to all of a first electroactive layer, a second electroactive layer, a third electroactive layer, and a fourth electroactive layer in a station in which the multilayer actuator as in Comparative Example 1 is attached to a flexible display panel.

In Example 1, Example 2, Comparative Example 1, and Comparative Example 2, the same conditions were applied except for polarization directions of four electroactive layers and directions of electric fields applied to the four electroactive layers. Specifically, in each of Example 1, Example 2, Comparative Example 1, and Comparative Example 2, a PVDF homopolymer was subject to a stretching process and a polling process, and then the PVDF homopolymer was laminated to prepare the four electroactive layers, and metal electrodes were deposited on both surfaces of each of the electroactive layers, thereby manufacturing a four-unit actuator. The polarization directions of the four electroactive layers were measured using polarization direction measuring equipment (APC International, Ltd., 90-2030), a maximum radius curvature and a minimum radius curvature were measured under a condition of 4.2 kVpp, and a vibratory acceleration was measured under a condition of 100 kHz and 1.4 kVpp.

Table 1 below lists a maximum radius curvature, a minimum radius curvature, and a radius curvature change value of each of Example 1, Example 2, Comparative Example 1, and Comparative Example 2.

TABLE 1

| | Minimum radius curvature (mm) | Maximum radius curvature (mm) | Radius curvature change value |
|---|---|---|---|
| Example 1 | 938 | 1682 | 744 |
| Example 2 | 741 | 1755 | 1014 |
| Comparative Example 1 | 983 | 1563 | 580 |
| Comparative Example 2 | 1303 | 1617 | 314 |

FIGS. 4A, 4B, 4C, and 4D are graphs obtained by measuring the vibratory accelerations of the multilayer actuators of Example 1, Example 2, Comparative Example 1, and Comparative Example 2.

Referring to FIGS. 4A, 4B, 4C, and 4D, Example 1 indicates a vibratory acceleration of about 0.19 G, Example 2 indicates a vibratory acceleration of about 0.27 G, Comparative Example 1 indicates a vibratory acceleration of about 0.10 G, and Comparative Example 2 indicates a vibratory acceleration of about 0.06 G.

As indicated by Table 1 and FIGS. 4A, 4B, 4C, and 4D, a driving displacement of a multilayer actuator can be increased or maximized at a constant voltage, when electric fields of the same direction are applied to the four electroactive layers in a state in which the polarization directions of the four electroactive layers are the same, as in Example 2.

In addition, a driving displacement of a multilayer actuator can be increased at a constant voltage in a case in which electric fields of different directions are applied to the four electroactive layers in a state in which displacement directions of the four electroactive layers are the same as in Example 1, as compared to a case in which electric fields of the same direction are applied to the four electroactive layers in a state in which displacement directions of the four electroactive layers are different as in Example 3. These results indicate that a driving displacement of a multilayer actuator can be effectively increased when directions of the electroactive layers are the same, irrespective of a direction of an electric field applied to each of the four electroactive layers.

Figure 5:
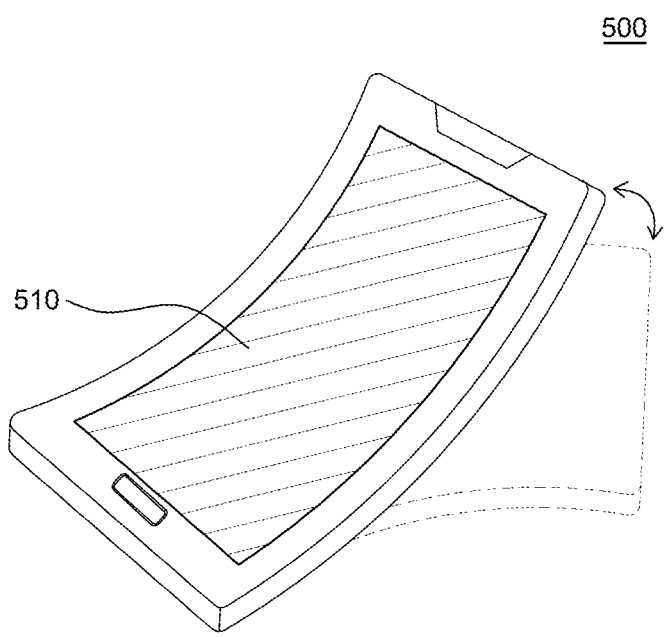
FIG. 5 is a diagram illustrating a state of a display device to describe variously deformed shapes of the display device according to an embodiment of the present disclosure.

FIG. 5 is a diagram illustrating a state of a display device 500 to describe variously deformed shapes of the display device 500 according to an embodiment of the present disclosure. In FIG. 5, a description will be given on the assumption that the display device 500 is a smartphone for convenience of description.

Referring to FIG. 5, a portion of the display device 500 may be bent upward or downward. Specifically, a multilayer actuator is fixed to a rear surface of a display screen 510, and the multilayer actuator and the whole display device 500 are deformed when the multilayer actuator is driven. In other words, when a portion of the multilayer actuator is bent upward or downward, a portion of the display device 500 may be bent upward or downward. Here, when the portion of the multilayer actuator is periodically bent upward or downward, the portion of the display device 500 may be bent upward or downward. In addition, when the portion of the multilayer actuator remains bent upward or downward, the portion of the display device 500 may remain bent upward or downward.

For example, as an output in response to a touch input to the display device 500 by a user, the portion of the display device 500 may be bent upward or downward. That is, when the display device 500 receives a message or a voice call, the portion of the display device 500 may be bent upward or downward as an output in response to the received message or voice call.

A bent portion, a bending direction, a bending time, a period of change of a bending direction, and the like of the display device 500 may be variously set through the display device 500. In other words, a change of shape of the display device 500 by the multilayer actuator may be variously set by the user, and is not limited to the above-mentioned example.

In the display device 500 comprising a multilayer actuator according to the present embodiment, the multilayer actuator is deformed into different shapes in response to various inputs. Specifically, a bent portion, a bending direction, a bending time, a period of change of a bending direction, and the like may be differently set for each input to the display device 500. As a result, the display device 500 may be deformed into various shapes by the multilayer actuator, thereby providing the user with various types of outputs.

Figure 6A:
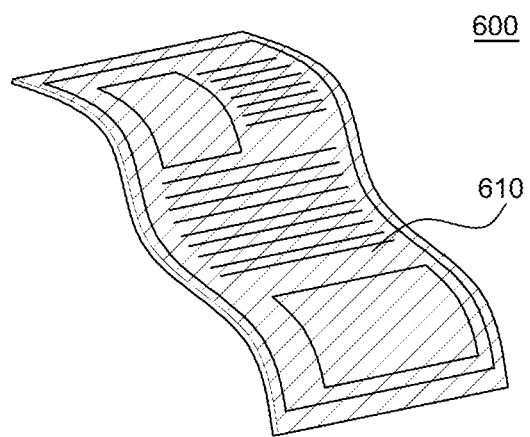
FIGS. 6A, 6B, and 6C are diagrams illustrating examples in which multilayer actuators according to embodiments of the present disclosure can be advantageously used.
Figure 6B:
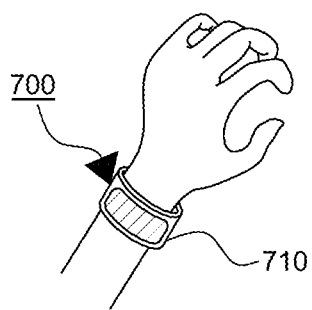
Figure 6C:
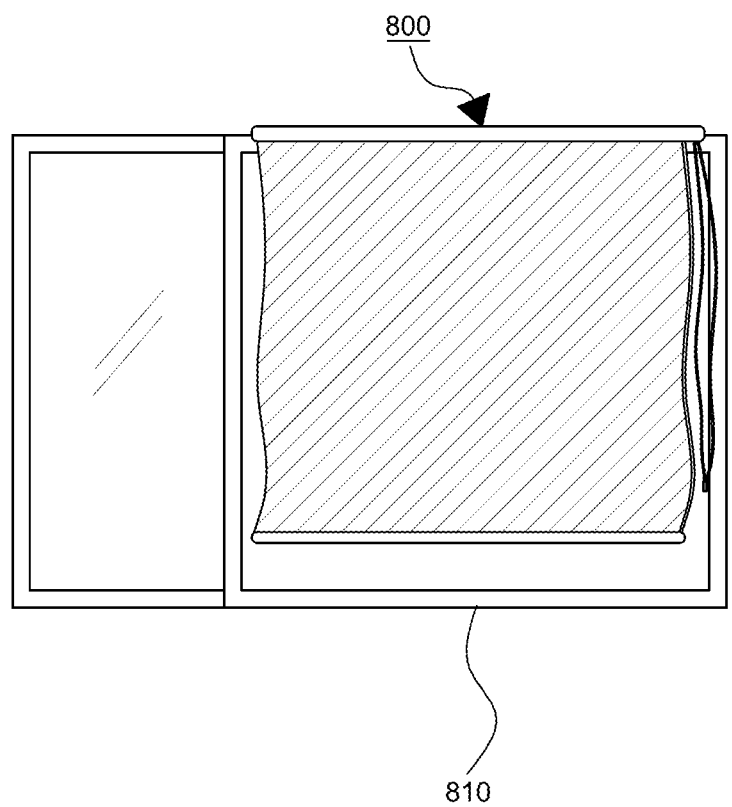

FIGS. 6A, 6B, and 6C are diagrams illustrating examples in which multilayer actuators according to embodiments of the present disclosure can be advantageously used.

FIG. 6A is a diagram illustrating an appearance of an electronic newspaper 600 comprising a multilayer actuator according to an embodiment of the present disclosure.

Referring to FIG. 6A, the electronic newspaper 600 comprises a display panel 610 and a multilayer actuator attached to a rear surface of the display panel 610.

The electronic newspaper 600 comprising the multilayer actuator according to the present embodiment may provide a feeling of actually reading a newspaper by the multilayer actuator. When a signal for turning a page is input through the display panel 610 of the electronic newspaper 600, a portion of the multilayer actuator receiving the input of the signal may be deformed. In this way, a portion of the electronic newspaper 600 may be temporarily bent in response to the multilayer actuator being deformed, and thus a feeling of turning a page of a newspaper may be provided to the reader.

In addition, when a new article is uploaded and displayed on the electronic newspaper 600 including the multilayer actuator according to the present embodiment, a portion of the electronic newspaper 600 is deformed, thereby providing a feedback that the article is uploaded. For example, when an article having a new headline is uploaded, a portion of the multilayer actuator comprising the uploaded article is deformed, thereby immediately providing a feedback to the reader that the article is uploaded.

FIG. 6B is a diagram illustrating a watch 700 comprising a multilayer actuator according to an embodiment of the present disclosure.

Referring to FIG. 6B, the watch 700 comprises a display panel 710 and a multilayer actuator attached to a lower portion of the display panel 710. Here, a description will be given on the assumption that the watch 700 is a smart watch for convenience of description.

In the watch 700 comprising the multilayer actuator according to the present embodiment, various functions of the watch 700 may be implemented by the multilayer actuator. General time information can be displayed through the display panel 710 of the watch 700. In addition, weather, news, and the like may be displayed through the display panel 710 of the watch 700. Further, the watch 700 may comprise a simple call function and determine heart rate of the user wearing the watch 700. For example, the multilayer actuator in the watch 700 may be contracted to tell time every hour or at a designated alarm time. In this way, time information can be provided by pressing a wrist of the user. In addition, the multilayer actuator in the watch 700 may be contracted when new weather information or a news is displayed, or a protrusion may be formed on a portion of the display panel 710 of the watch 700 when a call is received, thereby providing information to the user. Further, when the heart rate of the user measured through a portion of the watch 700 reaches a dangerous level, the multilayer actuator in the watch 700 can be contracted or deformed, thereby providing a warning alarm to the user.

FIG. 6C is a diagram illustrating a curtain 800 that comprises a multilayer actuator according to an embodiment of the present disclosure.

Referring to FIG. 6C, the curtain 800 comprises a display panel 810 and a multilayer actuator attached to a lower portion of the display panel 810.

In the curtain 800 comprising the multilayer actuator according to present embodiment, information about an external environment may be expressed in various manners by the multilayer actuator. Specifically, outside weather information may be displayed as a predetermined image through the display panel 810 of the curtain 800, and a specific state of weather may be expressed by changing a shape of the curtain 800. For example, when a wind blows in a cloudy weather, a cloud may be displayed through the display panel 810 of the curtain 800, a portion of the curtain 800 may be bent by the multilayer actuator according to a wind direction and a wind speed, and an area of the bent portion may vary. In other words, a direction in which the curtain 800 may be actually folded or swing according to the wind direction may be expressed as a bending direction of the curtain 800, and the area of the bent portion of the curtain 800 may increase as wind strength increases. In addition, when intensity of light entering through a window becomes less than or equal to a certain level, the curtain 800 may be automatically rolled up or folded in a left or right direction.

A multilayer actuator comprising a plurality of electroactive layers comprising a ferroelectric polymer according to an embodiment of the present disclosure is effective in implementing increased or improved vibratory acceleration at a constant voltage. Beneficially, the number of electroactive layers is more than three. Also, it is possible to provide a multilayer actuator having a low driving voltage and suitable for a mobile device. Additional advantages will be apparent from the description, or may be learned by practice of the invention.

Embodiments of the present disclosure have been described in more detail with reference to the accompanying drawings. However, the present disclosure is not restricted to the embodiments, and may be variously changed and implemented within the scope of the technical spirit of the present disclosure. Thus, the embodiments are disclosed to describe the technical spirit of the present disclosure rather than to restrict the technical spirit. The scope of the technical spirit of the present disclosure is not restricted by the embodiments. Therefore, the above-described embodiments should be understood illustratively rather than restrictively in all aspects. The scope of the present disclosure should be interpreted by claims below, and all technical spirits within an equivalent range thereof should be construed as being comprised in the scope of the present disclosure.

It will be apparent to those skilled in the art that various modifications and variation can be made in the present invention without departing from the concepts and scope of the invention. Thus, it is intended that the present invention cover the modifications and variations of this invention provided they come within the scope of the appended claims and their equivalents.

What is claimed is:

1. A multilayer actuator comprising:
   a plurality of unit actuators disposed on each other, each actuator having a first electroactive layer, a lower electrode and an upper electrode facing the lower electrode, wherein the first electroactive layer comprises a ferroelectric polymer and is interposed between the lower electrode and the upper electrode; and
   a plurality of adhesive layers, each adhesive layer disposed between two adjacent unit actuators to bond a lower electrode of a unit actuator adjacent to an upper portion of the adhesive layer and an upper electrode of a unit actuator adjacent to a lower portion of the adhesive layer,
   wherein polarization directions of the first electroactive layers of the plurality of unit actuators are substantially the same, and the plurality of adhesive layers have a high permittivity to form second electroactive layers, such that each of the plurality of adhesive layers is deformed by an electric field applied by the two adjacent electrodes.

2. The multilayer actuator according to claim 1, wherein a number of the first electroactive layers is at least three.

3. The multilayer actuator according to claim 1, wherein the first electroactive layers are made of the same material.

4. The multilayer actuator according to claim 1, wherein the first electroactive layers comprise a polyvinyldene fluoride (PVDF)-based polymer.

5. The multilayer actuator according to claim 1, wherein the first electroactive layers have a natural polarization applied by a stretching process or a polling process.

6. The multilayer actuator according to claim 1, wherein the polarization directions of the first electroactive layers are perpendicular to an extension direction of the first electroactive layers.

7. The multilayer actuator according to claim 1, wherein a number of the plurality of unit actuators is at least three.

8. The multilayer actuator according to claim 1, which is configured to generate an electric field between the lower electrode and the upper electrode of each unit actuator, wherein directions of the electric fields generated in the plurality of unit actuators are substantially the same.

9. The multilayer actuator according to claim 1, wherein the adhesive layers comprise a dielectric elastomer and a high-dielectric filler.

10. A display device, comprising a display panel and a multilayer actuator according to claim 1.

11. The display device according to claim 10, comprising an upper cover disposed over the display panel and the multilayer actuator and a lower cover disposed to face the upper cover and disposed below the display panel and the multilayer actuator, wherein the lower cover and the upper cover includes a material having a flexibility.

12. The display device according to claim 10, wherein the display panel comprises a flexible substrate.

13. A method for operating a multilayer actuator according to claim 1, comprising generating an electric field between the lower electrode and upper electrode of each unit actuator, wherein directions of the electric fields generated in the plurality of unit actuators are substantially the same.

* * * * *